(12) United States Patent
Yang

(10) Patent No.: US 8,148,190 B2
(45) Date of Patent: Apr. 3, 2012

(54) SEMICONDUCTOR DEVICE AND METHOD OF MANUFACTURING THE SAME

(75) Inventor: Taek Seung Yang, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 113 days.

(21) Appl. No.: 12/626,081

(22) Filed: Nov. 25, 2009

(65) Prior Publication Data

US 2010/0136734 A1 Jun. 3, 2010

(30) Foreign Application Priority Data

Nov. 28, 2008 (KR) ........................ 10-2008-0119334

(51) Int. Cl.
*H01L 21/26* (2006.01)
(52) U.S. Cl. ................... 438/70; 438/473; 257/E21.328
(58) Field of Classification Search .................. 438/473, 438/584–688
See application file for complete search history.

(56) References Cited

U.S. PATENT DOCUMENTS

| | | | | |
|---|---|---|---|---|
| 3,849,204 A | * | 11/1974 | Fowler | 438/475 |
| 5,563,427 A | * | 10/1996 | Yudasaka et al. | 257/72 |
| 5,576,229 A | * | 11/1996 | Murata et al. | 438/162 |
| 6,274,439 B1 | * | 8/2001 | Ito | 438/278 |
| 6,835,590 B2 | * | 12/2004 | Lee | 438/69 |
| 7,595,211 B2 | * | 9/2009 | Kim | 438/57 |
| 7,601,557 B2 | * | 10/2009 | Baek | 438/70 |
| 7,907,226 B2 | * | 3/2011 | Yang et al. | 349/43 |
| 2007/0072421 A1 | * | 3/2007 | Palsule et al. | 438/689 |
| 2007/0224740 A1 | * | 9/2007 | Fukuda et al. | 438/149 |
| 2008/0128705 A1 | * | 6/2008 | Ishiguro | 257/72 |
| 2010/0062559 A1 | * | 3/2010 | Park et al. | 438/65 |

* cited by examiner

*Primary Examiner* — Savitr Mulpuri
(74) *Attorney, Agent, or Firm* — Saliwanchik, Lloyd & Eisenschenk

(57) ABSTRACT

Disclosed are methods of manufacturing a semiconductor device. The method of manufacturing one semiconductor device includes forming a transistor structure on a semiconductor substrate, forming a metal interconnection layer on the transistor structure, forming a protective layer on the metal interconnection layer, and implanting hydrogen ions into the semiconductor substrate having the protective layer by using a hydrogen ion implanter. Hydrogen ions are stably and effectively implanted into a selected region by using a hydrogen ion implanter in the manufacturing process of the semiconductor device, thereby facilitating the manufacturing process and improving the performance of the semiconductor device.

12 Claims, 4 Drawing Sheets

SEMICONDUCTOR DEVICE AND METHOD OF MANUFACTURING THE SAME

CROSS-REFERENCE TO RELATED APPLICATION

This application claims the benefit under 35 U.S.C. §119 of Korean Patent Application No. 10-2008-0119334, filed Nov. 28, 2008, which is hereby incorporated by reference in its entirety.

BACKGROUND

Generally, an image sensor is a semiconductor device that converts an optical image into an electric signal.

Recently, the CMOS image sensor has been spotlighted as the next generation image sensor.

A conventional CMOS image sensor includes a silicon substrate having a pixel region and a transistor region provided thereon with an interlayer dielectric layer including undoped silicon glass (USG), a bonding pad on the interlayer dielectric layer, and a protective layer on the interlayer dielectric layer having the bonding pad.

The CMOS image sensor manufactured in such a manner has many dangling bonds on a gate insulating layer and the silicon substrate. The dangling bonds degrade the performance of the image sensor.

In particular, when forming an isolation layer on the silicon substrate, many dangling bonds existing on the interface between the isolation layer and the silicon substrate may serve as a dark current source. Further, the dangling bonds generated when forming the gate insulating layer may reduce charge transfer efficiency because they may serve as a trap that captures electrons during transfer of photoelectrons.

Therefore, according to the manufacturing process of the CMOS image sensor, an annealing process is performed to remove defects such as dangling bonds and humidity.

An annealing process for the conventional CMOS image sensor is performed for a long time while applying the mixture of hydrogen gas and nitrogen gas at a normal pressure or at a pressure lower than the normal pressure, so the product yield may be lowered and device characteristics may be degraded.

BRIEF SUMMARY

An embodiment provides a method of manufacturing a semiconductor device capable of effectively implanting many hydrogen ions into a selected portion of a substrate by using a hydrogen ion implanter in the manufacturing process of the semiconductor device.

According to one embodiment, a method of manufacturing a semiconductor device includes forming a transistor structure on a semiconductor substrate, forming a metal interconnection layer on the transistor structure, forming a protective layer on the metal interconnection layer, and implanting hydrogen ions into the semiconductor substrate having the protective layer by using a hydrogen ion implanter.

According to another embodiment, a method of manufacturing an image sensor includes forming a transistor structure on a semiconductor substrate, forming an insulating layer on the transistor structure, and implanting hydrogen ions into the insulating layer by using a hydrogen ion implanter.

According to yet another embodiment, a method of manufacturing a semiconductor device includes forming a transistor structure on a semiconductor substrate, forming a metal interconnection layer on the transistor structure, and implanting hydrogen ions into the metal interconnection layer by using a hydrogen ion implanter.

DETAILED DESCRIPTION

Figure 1:
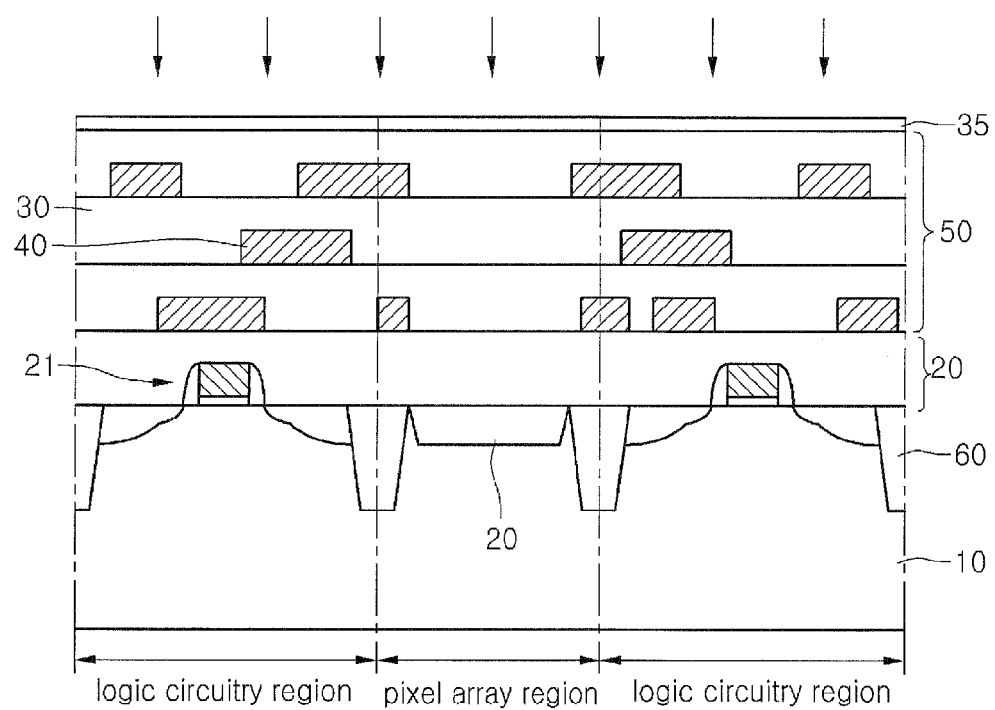
FIGS. 1 and 2 are cross-sectional views showing a semiconductor device according to the embodiment.

Hereinafter, methods of manufacturing a semiconductor device according to embodiments will be described in detail with reference to accompanying drawings. The size (dimension) of elements shown in the drawings may be magnified for the purpose of clear explanation and the real size of the elements may be different from the size of elements shown in drawings. In addition, the present invention may not include all the elements shown in the drawings and may not be limited thereto. The elements except for essential elements of the present invention can be omitted or added without limitation. In the description of embodiments, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Detailed description about well-known functions or configurations may make the subject matter of the disclosure unclear. Accordingly, hereinafter, description will be made regarding only components directly related to the technical scope of the disclosure.

Figure 2:
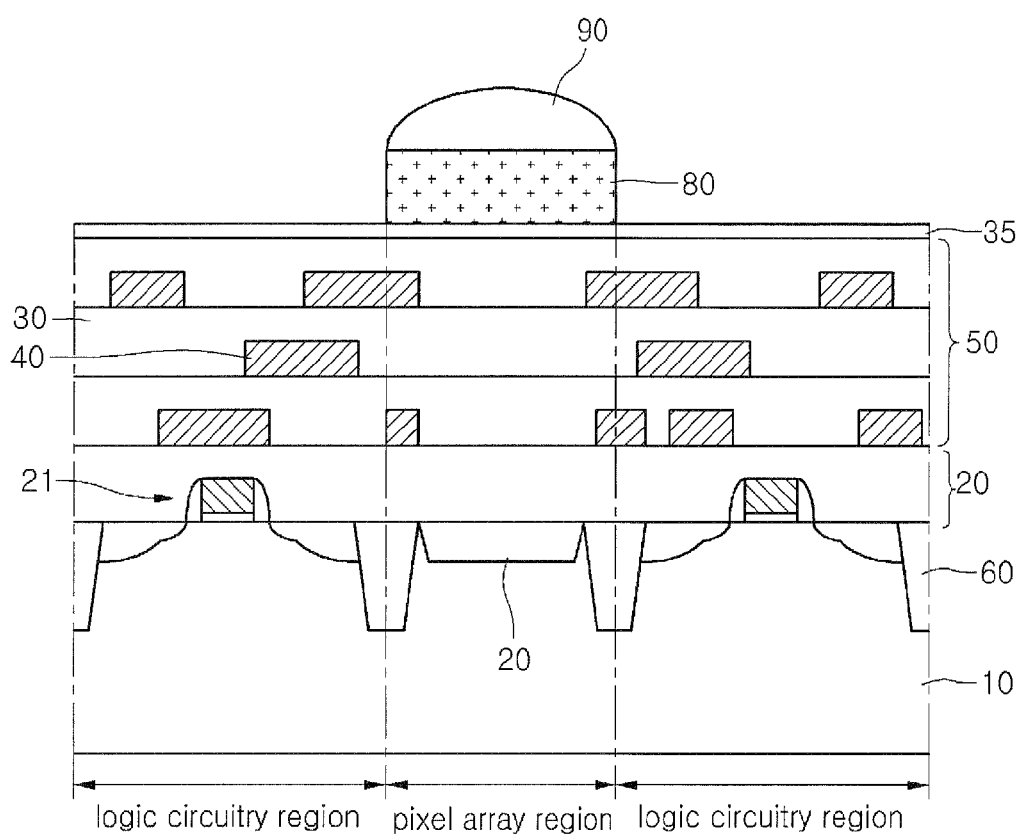

FIGS. 1 and 2 are cross-sectional views showing a semiconductor device according to the embodiment.

As shown in FIG. 1, a circuitry layer 20 including a transistor structure 21 is formed on a semiconductor substrate 10, and a metal interconnection layer 50 is formed on the circuitry layer 20. A protective layer 35 is formed on the metal interconnection layer 50.

The semiconductor substrate 10 can be a single or poly crystalline silicon substrate. The semiconductor substrate 10 may be doped with P-type impurities or N-type impurities.

An isolation layer 60 may be formed on the semiconductor substrate 10 to define an active region and a field region.

The semiconductor substrate 10 includes a pixel array region, in which pixels are aligned in the form of a matrix, and a logic circuitry region around the pixel array region.

Although not shown in detail, a transistor circuitry, which can include a transfer transistor connected with a photodiode to convert received optical charges into an electric signal, a reset transistor, a drive transistor, and a select transistor, may be included in the circuitry layer 20 of the pixel array region.

In addition, transistors are formed in the circuitry layer 20 of the logic circuitry region to drive the pixel array region.

The metal interconnection layer 50 may include a plurality of interlayer dielectric layers 30. The metal interconnection layer 50 also includes metal interconnections 40 connected to the circuitry layer 20 between the interlayer dielectric layers 30.

The metal interconnection 40 may be formed by using various conductive materials including metal, alloy thereof, or silicide. For example, the metal interconnection 40 may include aluminum (Al), copper (Cu), cobalt (Co) or tungsten (W). The metal interconnection 40 may have a lower barrier layer/metal layer/upper barrier layer structure. The lower and upper barrier layers may include Ti/TiN. A plug (not shown) for the connection between the metal interconnections 40 is formed in a via hole of the interlayer dielectric layer 30. For example, the plug may include a lower barrier layer/tungsten layer.

The interlayer dielectric layer 30 of the metal interconnection layer 50 may include an oxide layer. The interlayer dielectric layer 30 may include undoped silicate glass (USG) or boron phosphorus silicate glass (BPSG).

The protective layer 35 includes at least one of an oxide layer and a nitride layer.

According to embodiments, after the above structure is formed, the semiconductor device is introduced into a hydrogen ion implanter, and a curing process is performed.

When the protective layer 35 has been formed, the semiconductor device has a stack thickness of about 3 μm to 5 μm from the silicon substrate in the case of a 180 nm product, and has a stack thickness of about 2 μm to 4 μm in the case of a 130 nm product. In addition, the semiconductor device has a stack thickness of about 1 μm to 3 μm in the case of 90 nm to 110 nm products.

According to an embodiment, hydrogen ions are implanted into the semiconductor device under ion implantation energy of 50 keV to 500 keV for the purpose of the curing process.

In order to remove dangling bonds from a silicon surface, the hydrogen ion implantation process in accordance with embodiments of the present invention may be performed before or after a silicon nitride layer has been deposited. The hydrogen ion implantation process may be performed before the first metal interconnection or another metal interconnection has been formed by adjusting energy. In other words, the hydrogen ion implantation process may be performed at a predetermined process step after a back-end-of-line (BEOL) process starts.

According to an embodiment, hydrogen ions may be implanted into only a specific region based on the characteristic of an ion implantation scheme.

For example, in the case of the image sensor, a curing process using hydrogen ions may be individually performed with respect to a logic circuitry region and a pixel array region.

In the case of a foundry compatible technology (FCT), the curing process may be individually performed with respect to a low voltage (LV), middle voltage (MV), or high voltage (HV) device, or a PMOS or NMOS device.

Meanwhile, after the hydrogen ion implantation process has been performed, temperature is preferably prevented from being increased to 500° C. or more.

When the hydrogen ions are implanted, hydrogen ions contained in the protective layer 35 are out-diffused to the surface of the semiconductor substrate 10 and combined with dangling bonds, thereby achieving damage curing.

If hydrogen ions are implanted into the semiconductor substrate 10 by a hydrogen ion implanter after a silicon nitride layer has been formed as the protective layer 35 of the semiconductor device 10, defects of the semiconductor substrate 10 are reduced and dangling bonds are removed by hydrogen ions, so that the characteristic of a device is improved, and a dark current can be reduced in the image sensor.

When hydrogen ions are implanted within a furnace, as in a related art, because the hydrogen ion implantation process is performed at a temperature of 400° C. or more for a long time, metal interconnections are peeled off or the characteristic of the metal interconnections is degraded. In contrast, according to embodiments of the present invention, since the hydrogen ion implantation process is performed in the hydrogen ion implanter, the characteristic of the semiconductor device is not degraded and defects do not occur.

Referring to FIG. 2, a color filter layer 80 including red, green, and blue color filters are formed on the protective layer 35 of the semiconductor substrate 10 that has been subject to a hydrogen ion implantation process.

Thereafter, a micro-lens 90 can be formed on the color filter layer 80.

The curing process based on a hydrogen ion implanter in accordance with the invention is applicable to all semiconductor devices allowing the curing process as well as the image sensor.

According to embodiments, hydrogen ions can be effectively implanted at various depths by adjusting ion implantation energy. According to certain embodiments, the hydrogen ions can be implanted under ion implantation energy of 50 keV to 500 keV.

For example, hydrogen ions can exist at the depth of 780 nm under ion implantation energy of 80 keV, other hydrogen ions can exist at the depth of 1300 nm under 150 keV.

According to the embodiment, a desired amount of hydrogen ions are precisely and effectively implanted into a desirable area through the curing process such that the dangling bonds existing on the silicon surface are removed. Accordingly, the characteristic of a device can be improved.

FIGS. 3 to 6 are cross-sectional views showing the hydrogen ion implantation process for the semiconductor device according to an embodiment.

Figure 3:
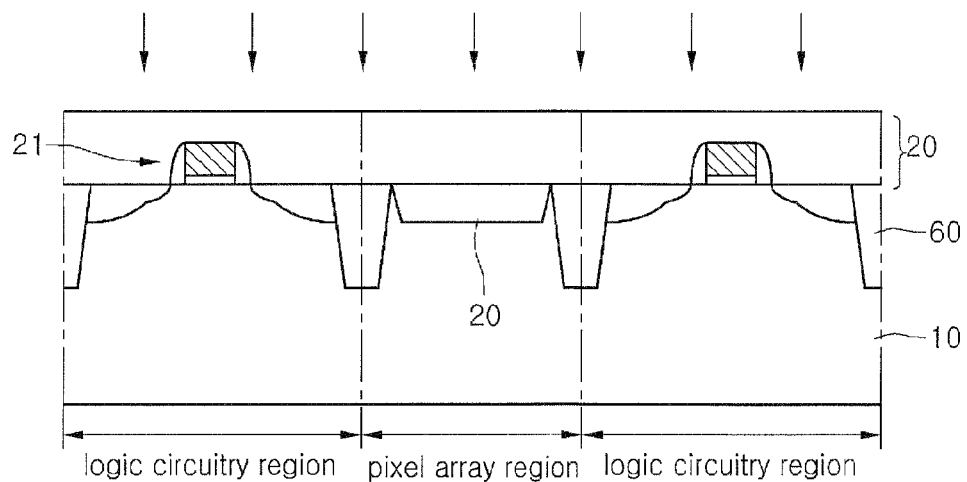
FIGS. 3 to 6 are cross-sectional views showing a hydrogen ion implantation process for the semiconductor device according to the embodiment.

Referring to FIG. 3, after forming an isolation layer 60, photodiode 20, transistor structure 21, and circuitry layer 20 including an insulating layer to cover the transistor structure 21 on the semiconductor substrate 10, a hydrogen ion implantation process in accordance with an embodiment can be performed with respect to the semiconductor device using a hydrogen implanter (not shown). In other words, the hydrogen ion implantation process can be performed before the BEOL process.

For example, the hydrogen implanter (not shown) can include an ion beam source configured to generate hydrogen ions into an ion beam with a specific dose range, and an analyzer magnet configured to remove undesired species from the ion beam. The hydrogen ion implanter can include an electrostatic chuck having a backside gas thermal coupling.

Accordingly, dangling bonds generated after a gate process can be effectively removed from the silicon surface by effectively implanting hydrogen ions into the silicon substrate by using the hydrogen ion implanter.

In addition, the hydrogen ions may be implanted after a photoresist pattern is formed on the circuitry layer 20.

Figure 4:
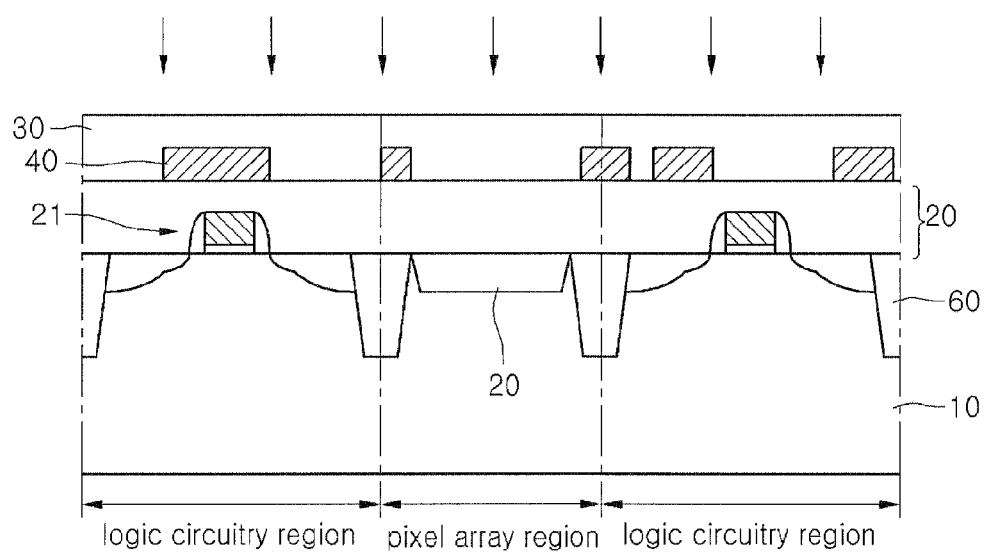
Figure 5:
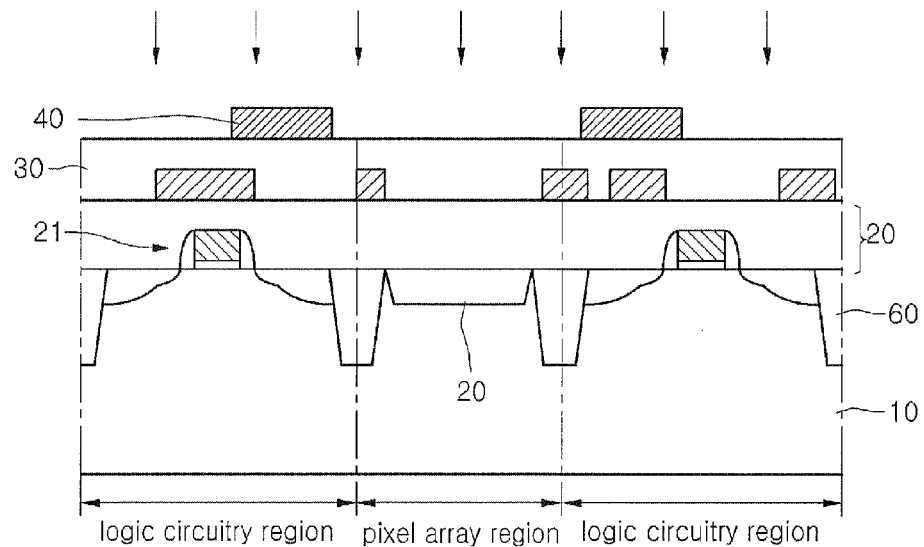

Referring to FIGS. 4 and 5, the hydrogen ion implantation process may be performed with respect to the semiconductor device in a state in which an interlayer dielectric layer 30 is formed at the uppermost layer after the isolation layer 60, the circuitry layer 20 including the transistor structure 21 and the insulating layer, and the metal interconnection layer 50 have been formed on the semiconductor substrate 10.

The metal interconnection layer 50 may include the interlayer dielectric layer 30 having a multi-layer structure and the metal interconnections 40.

The hydrogen ion implantation process may be performed at a predetermined process step of the process of forming the metal interconnection layer 50.

The hydrogen ions may be selectively implanted only into a desired region by using a photoresist pattern (see reference 70 of FIG. 6) formed before performing the hydrogen ion implantation process.

As shown in FIG. 4, hydrogen ions may be implanted by using a hydrogen ion implanter after the insulating layer has been formed in the middle of forming the metal interconnection layer. In other words, the hydrogen ion implantation process may be performed by using the hydrogen ion implanter after at least one interlayer dielectric layer has been formed.

As shown in FIG. 5, hydrogen ions may be implanted by using a hydrogen ion implanter after the metal interconnection 40 has been formed in the middle of forming the metal interconnection layer 50.

Figure 6:
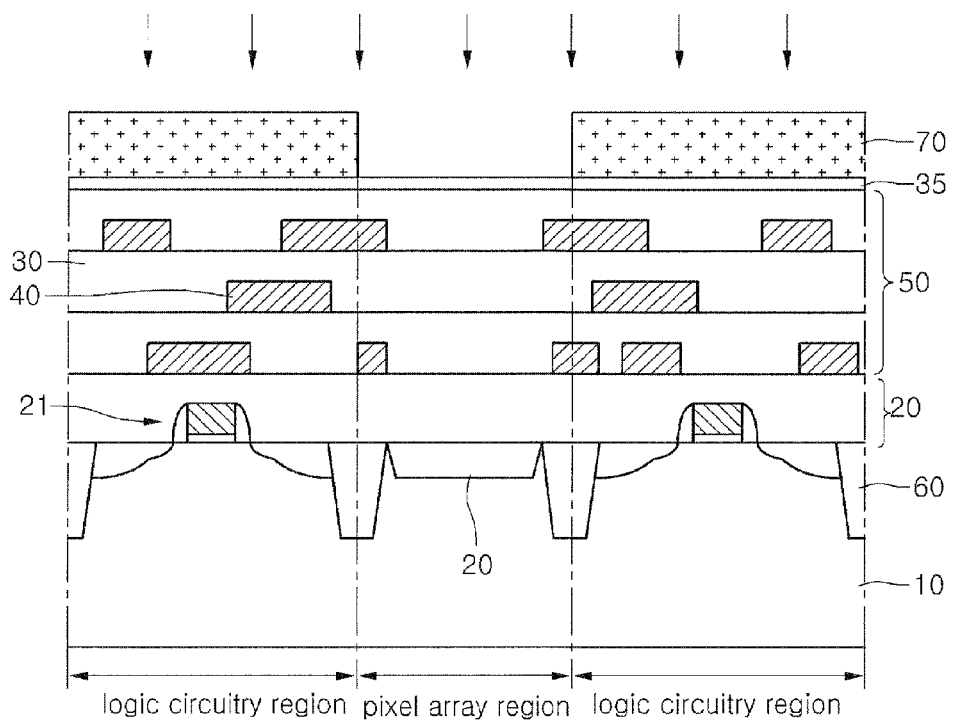

As shown in FIG. 6, according to the embodiment, hydrogen ions are stably and effectively implanted into a selected region by using a hydrogen ion implanter in the manufacturing process of the semiconductor device, thereby facilitating the manufacturing process and improving the performance of the semiconductor device.

According to an embodiment, hydrogen ions may be implanted only into a pixel array region through a masking process of the semiconductor device. Therefore, dangling bonds generated when forming the gate insulating layer can be inhibited from serving as a trap which captures electrons during transfer of photoelectrons such that charge transfer efficiency is not reduced. In addition, dangling bonds can be effectively removed from a necessary region.

According to an embodiment, hydrogen ions may be implanted with different concentration according to points of the semiconductor device, so that curing effects can be effectively maximized.

According to an embodiment, when comparing with a curing scheme to implant hydrogen ions in a furnace, a great amount of hydrogen ions can be more effectively implanted into one point (or region) to remove dangling bonds from the silicon surface. Accordingly, the characteristic of a device can be improved.

According to an embodiment, in the image sensor, a curing process based on a hydrogen ion implantation scheme can be individually performed with respect to a pixel array region and a logic circuitry region through a masking process.

According to an embodiment for a FCT, LV, MV, and HV devices, or PMOS and NMOS devices can be individually cured.

According to an embodiment, in a semiconductor device, after a photodiode and transistors are formed on a silicon substrate and then a pre-metal dielectric (PMD) layer is formed, at least one hydrogen ion implantation process is performed in a hydrogen ion implanter to reduce a dark current and stabilize a device, so that the characteristic of a device can be improved.

According to the semiconductor device of an embodiment, at least one hydrogen ion implantation process is performed in a hydrogen ion implanter during the forming of a metal interconnection layer 50 having a plurality of interlayer dielectric layers 30 and metal interconnections 40. For example, the hydrogen ion implantation process can be performed after one of the interlayer dielectric layers 30 has been formed, or after a metal interconnection 40 is formed in or on the interlayer dielectric layer 30. In this case, at least one hydrogen ion implantation process is performed in the hydrogen ion implanter when forming the metal interconnection layer 50, thereby removing dangling bonds from the interface between the isolation layer and the silicon substrate 10, the metal interconnection, and the interlayer dielectric layer, so that metal interconnection characteristics can be improved.

According to the semiconductor device of an embodiment, after forming a bonding pad on a top interlayer dielectric layer 30 and forming a protective layer on the interlayer dielectric layer having the bonding pad, at least one hydrogen ion implantation process can be performed in the hydrogen ion implanter. Accordingly, dangling bonds can be removed from the interface between the isolation layer 60 and the silicon surface 10, the metal interconnection 40, and the interlayer dielectric layer 30, so that the metal interconnection characteristic can be improved.

At least one curing process based on a hydrogen ion implantation scheme is performed in the manufacturing process of the semiconductor device. If necessary, the curing process may be performed several times, or only one curing process may be performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

Although an embodiment has been described with reference to a number of illustrative embodiments thereof, it should be understood that numerous other modifications and embodiments can be devised by those skilled in the art that will fall within the spirit and scope of the principles of this disclosure.

What is claimed is:

1. A method of manufacturing a semiconductor device, the method comprising:
    forming a transistor structure and a photodiode on a semiconductor substrate;
    forming a metal interconnection layer on the transistor structure and the photodiode;
    forming a protective layer on the metal interconnection layer;
    implanting hydrogen ions into the semiconductor substrate having the protective layer by using a hydrogen ion implanter; and
    forming a color filter layer on the protective layer after the hydrogen ions have been implanted.

2. The method of claim 1, further comprising forming a photoresist pattern on a portion of the protective layer before the hydrogen ions have been implanted, wherein the implanting of the hydrogen ions into the semiconductor substrate uses the photoresist pattern as an implant mask.

3. The method of claim 2, wherein the photoresist pattern exposes a pixel array region of the semiconductor substrate.

4. The method of claim 1, wherein the hydrogen ions are implanted into the semiconductor substrate under ion implantation energy of 50 keV to 500 keV.

5. A method of manufacturing an image sensor, the method comprising:
   forming a transistor structure and a photodiode on a semiconductor substrate;
   forming an insulating layer on the transistor structure and the photodiode;
   forming a metal interconnection layer on the insulating layer;
   forming a protective layer on the metal interconnection layer;
   implanting hydrogen ions into the insulating layer by using a hydrogen ion implanter; and
   forming a color filter layer on the protective layer, after the implanting of the hydrogen ions into the insulating layer.

6. The method of claim 5, further comprising forming a photoresist pattern on a portion of the insulating layer before the hydrogen ions have been implanted, wherein the implanting of the hydrogen ions into the insulating layer uses the photoresist pattern as an implant mask.

7. The method of claim 5, wherein the hydrogen ions are implanted into the insulating layer under ion implantation energy of 50 keV to 500 keV.

8. A method of manufacturing a semiconductor device, the method comprising:
   forming a transistor structure and a photodiode on a semiconductor substrate;
   forming a metal interconnection layer on the transistor structure and the photodiode;
   implanting hydrogen ions into the metal interconnection layer by using a hydrogen ion implanter; and
   forming a color filter layer on the metal interconnection layer, after the hydrogen ions have been implanted.

9. The method of claim 8, further comprising forming a photoresist pattern on a portion of the metal interconnection layer before the hydrogen ions have been implanted, wherein the implanting of the hydrogen ions into the metal interconnection layer uses the photoresist pattern as an implant mask.

10. The method of claim 8, wherein the hydrogen ions are implanted into the metal interconnection layer under ion implantation energy of 50 keV to 500 keV.

11. The method of claim 8, wherein the metal interconnection layer includes a plurality of interlayer dielectric layers and metal interconnections, and wherein the implanting of the hydrogen ions into the metal interconnection layer is performed after at least one of the interlayer dielectric layers is formed.

12. The method of claim 8, wherein the metal interconnection layer comprises a plurality of interlayer dielectric layers and a metal interconnection, and wherein the implanting of the hydrogen ions into the metal connection layer is performed after the metal interconnection is formed.

* * * * *